US 6,683,459 B2

(12) United States Patent
Dindis et al.

(10) Patent No.: US 6,683,459 B2
(45) Date of Patent: Jan. 27, 2004

(54) IDENTIFICATION OF A DISTRIBUTION OF TRANSFORMERS AND FAULT LOCATION IN PRIMARY UNDERGROUND LOOP SYSTEMS

(75) Inventors: Gokhan Dindis, Bethlehem, PA (US); Henning Oetjen, Allentown, PA (US)

(73) Assignee: HDW Electronics, Inc., Bethlehem, PA (US)

( * ) Notice: Subject to any disclaimer, the term of this patent is extended or adjusted under 35 U.S.C. 154(b) by 0 days.

(21) Appl. No.: 09/916,462

(22) Filed: Jul. 26, 2001

(65) Prior Publication Data

US 2003/0052694 A1 Mar. 20, 2003

(51) Int. Cl.[7] .............................................. G01R 31/11
(52) U.S. Cl. ........................................ 324/534; 324/533
(58) Field of Search ................................ 324/500–537, 324/547, 533, 534

(56) References Cited

U.S. PATENT DOCUMENTS

| | | | | |
|---|---|---|---|---|
| 3,727,128 A | * | 4/1973 | McFerrin | 324/533 |
| 5,128,619 A | * | 7/1992 | Bjork et al. | 324/533 |
| 5,272,439 A | * | 12/1993 | Mashikian et al. | 324/533 |
| 5,352,984 A | * | 10/1994 | Piesinger | 324/532 |
| 5,369,366 A | * | 11/1994 | Piesinger | 324/533 |
| 5,530,367 A | * | 6/1996 | Bottman | 324/616 |
| 5,994,905 A | * | 11/1999 | Franchville | 324/533 |
| 6,161,077 A | * | 12/2000 | Fawcett | 324/523 |

OTHER PUBLICATIONS

P. Boets and L.V. Biesen, "The Modelling Aspect of Transmission Line Networks", Instrument and Measurement Technology Conference, 1992. IMTC '92., 9th IEEE, May 1992, pp.: 137–141.*

* cited by examiner

*Primary Examiner*—Jay Patidar
*Assistant Examiner*—Timothy J. Dole
(74) *Attorney, Agent, or Firm*—Finnegan, Henderson, Farabow, Garrett & Dunner, L.L.P.

(57) ABSTRACT

A system for determining the locations of faults on a cable by determining the positions of transformers is described. The locations of transformers can be determined in a reflected signal trace resulting from a voltage pulse coupled into the cable. The reflected pulse signals on the reflected signal trace from the transformers follow a predictable attenuation pattern. Therefore, an algorithm executing on a computer system can be utilized to determine the location of transformers in a reflected signal trace. A fault can then be located by, for example, applying a high voltage to the cable and measuring a new reflected signal trace which shows reflection from the fault. The fault, then, can be located relative to neighboring transformers.

25 Claims, 10 Drawing Sheets

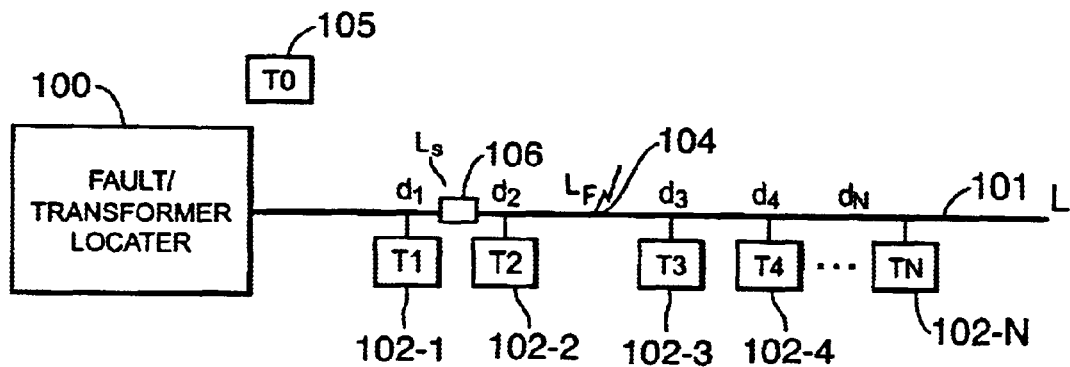
FIG. 1A
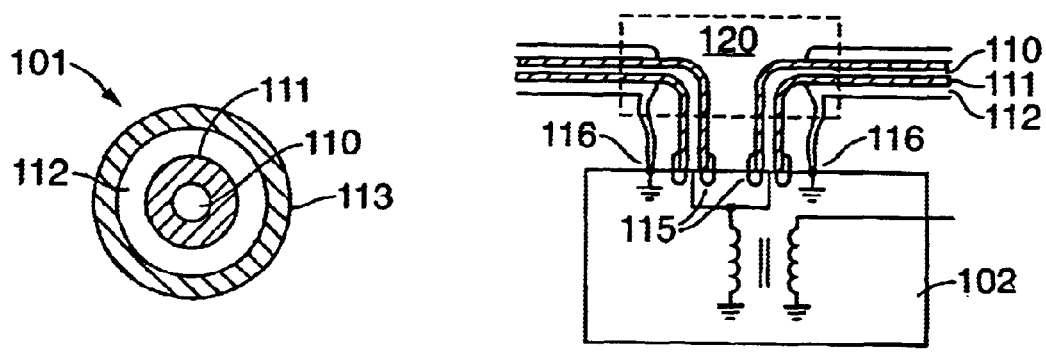
FIG. 1C
FIG. 1D
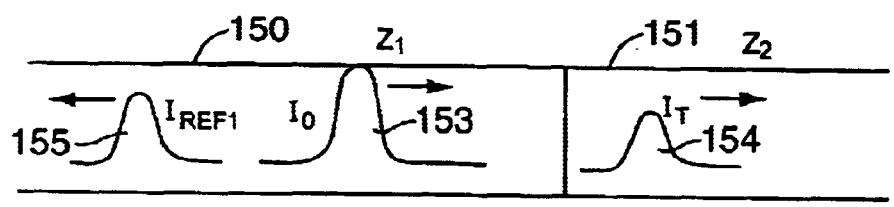
FIG. 1B

IDENTIFICATION OF A DISTRIBUTION OF TRANSFORMERS AND FAULT LOCATION IN PRIMARY UNDERGROUND LOOP SYSTEMS

CROSS-REFERENCE TO CD-ROM APPENDIX

CD-ROM Appendix A, which is a part of the present disclosure, is a computer program listing appendix consisting of five (5) text files. CD-ROM Appendix A includes a software program executable on a controller as described below. The total number of compact disks including duplicates is two. Appendix B, which is part of the present specification, contains a list of the files contained on the compact disk. The attached CD-ROM Appendix A is formatted for an IBM-PC operating a Windows operating system.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

These and other embodiments are further discussed below.

BACKGROUND

1. Field of the Invention

The present invention is related to analysis of cables and, in particular, to the location of transformers and faults in a cable.

2. Discussion of Related Art

Location of electrical faults in a cable, particularly an underground power cable, can be particularly problematic. In some areas, the power cable is accessible only at connections with transformers, which can be located in hard to reach areas. For example, transformers may be located in inaccessible back yards. It may, in fact, be dangerous for workers to access transformers in order to isolate sections of cables to locate possible electrical faults.

Generally, faults are located in a power cable by isolating and testing sections of the power cable for the fault. A power cable may include several transformers where cables can be disconnected in order that a fault that occurs between adjacent transformers can be located. In addition to being possibly dangerous for line workers to access individual transformers, it is also time consuming to disconnect the cable from adjacent transformers in order to check the cable between the transformers for faults.

Therefore, there is a need for a system that will locate a fault over a long length of cable which includes multiple transformers and, in particular, locate the particular section between transformers that includes the electrical fault.

SUMMARY

In accordance with the present invention, a system for automatically locating transformers is described. A fault, then, can be located between adjacent transformers. A transformer can be located by applying a voltage pulse to the cable and measuring the return, reflected signal as a function of time, which results in a reflected signal trace. Transformers, splices, and faults create changes in the impedance of the cable which will reflect the voltage pulse in predictable ways. In particular, transformers will reflect a percentage of the voltage pulse as the voltage pulse travels past the transformer. Since the amplitude of the voltage pulse decreases exponentially with the distance traveled in the cable, the amplitude of the reflected pulses from various transformers decreases substantially exponentially with the distance to the transformer.

A locator for locating the positions of transformers, then, can include a pulse generator, a detector, and a processor (computer). The pulse generator generates the voltage pulse which travels along the cable. The detector measures the reflected signal from the cable. The processor receives the reflected signal from the cable and acquires a reflected signal trace, which is the compiled reflected signal as a function of time from the generation of the voltage pulse. In some embodiments, the time parameter can be converted to distance along the cable by knowing the pulse velocity in the cable.

In some embodiments, the locator can locate an end-of-cable position by recognizing the reflected pulse from the end of the cable. If the cable is open, then the pulse at the end of the cable is a positive amplitude pulse and therefore can be located by searching for the positive pulse with the largest amplitude. In some embodiments, the operator can determine whether the end of the cable has actually been located or not by the locator. A gain can be set by adjusting the reflected pulse from the end of the cable to be above a threshold value. In some embodiments, a distance dependent gain can be determined. The gain is output to the detector which receives the reflected signals from the cable and amplifies them. Further, the operator can locate a range of the reflected signal trace in which to search for transformers and cable faults.

Once the gain is set, then a reflected signal trace can be acquired with the set gain. In some embodiments, the operator can adjust the search range of the reflected signal trace. In some embodiments, the reflected signal trace may be data averaged over several voltage pulses. In some embodiments, the reflected signal trace can be digitally high-pass filtered to remove any offsets which may occur. Further, in embodiments with a distance-dependent gain, the reflected signal trace can be adjusted to counteract for the effects of the gain at the detector.

The locator, then, can find the reflected pulses on the reflected signal pulse that corresponds to the transformers on the cable. In some embodiments, the locator first finds the most negative peak and the next most negative peak. The most negative peak correlates with the position of a first transformer (i.e., the transformer closest to the locator) and the next most negative peak correlates with the position of the second transformer. The locator can then fit an attenuation curve with the amplitude and position of the most negative peak and the amplitude and position of the next most negative peak. A third peak can then be located by finding the next peak with an amplitude and position which substantially adheres to the attenuation curve. In some embodiments, the first peak and the next peak can be utilized to calculate a new attenuation curve. In some embodiments, all of the peaks are utilized to calculate the attenuation curve. Further peaks can then be found by locating peaks that fall on the attenuation curves calculated.

Once the location of each transformer on the cable is located, a high voltage can be applied to the cable. The high voltage causes dielectric breakdown at the fault, causing the fault to act as a short to the voltage pulse. Therefore, a voltage pulse applied to the cable will locate the fault in the cable. The fault, then, is located between adjacent transformers which have already been located.

Once the fault is isolated between two adjacent transformers, the line worker can go to the identified section of the cable and, in some cases, perform a fault location procedure on the isolated cable segment. The cable, then, can be exposed and repaired.

These and other embodiments of the invention are further discussed below with respect to the following figures.

BRIEF DESCRIPTION OF THE FIGURES

FIG. 1A shows an embodiment of a cable system for power distribution.

FIG. 1B illustrates reflection of a voltage pulse from an impedance mismatch.

FIG. 1C shows a cross section of a cable in the cable system shown in FIG. 1A.

FIG. 1D shows an embodiment of a transformer connection to the cable in the cable system of FIG. 1A.

DETAILED DESCRIPTION

Figure 2:
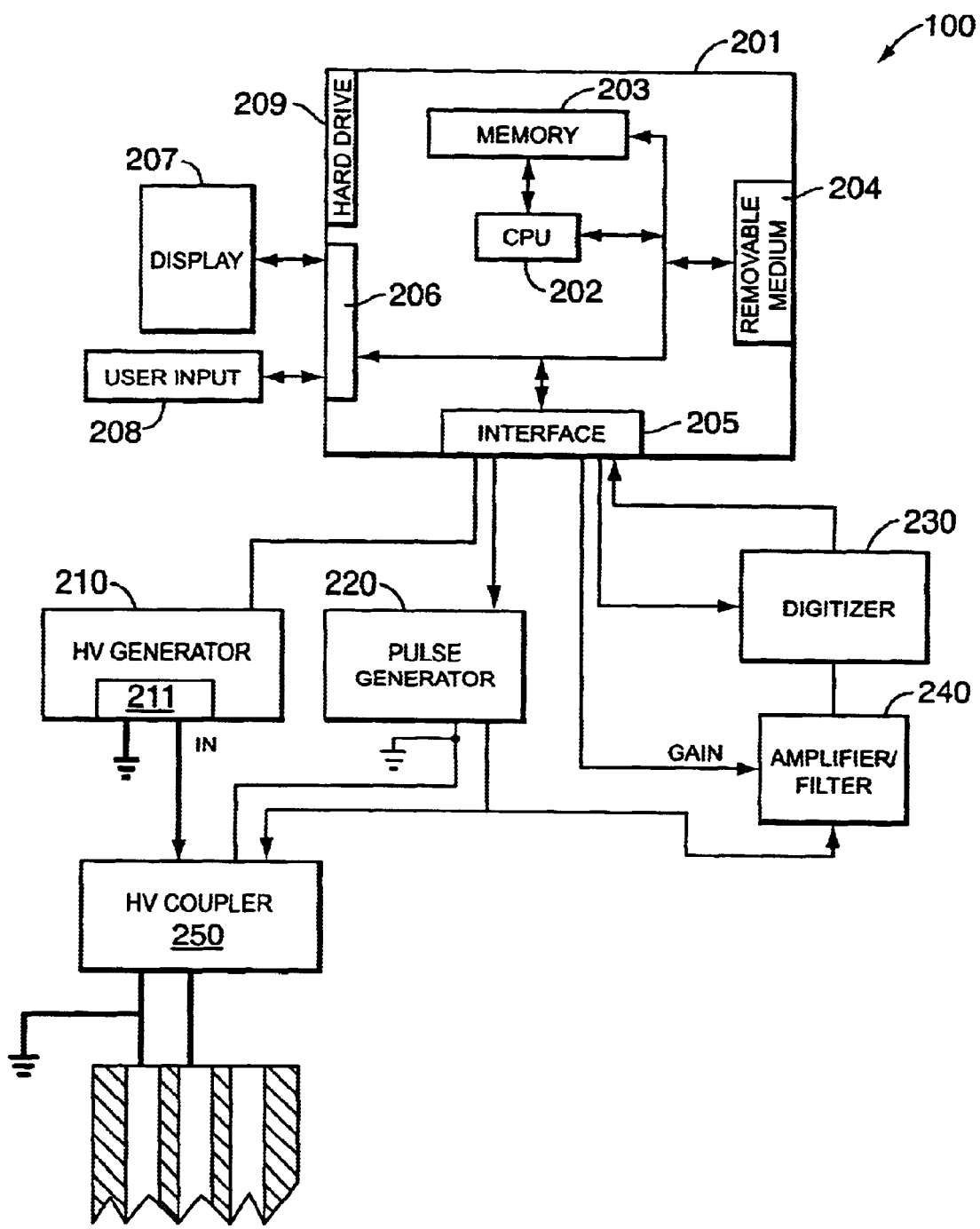
FIG. 2 shows an embodiment of a fault and transformer locator apparatus according to the present invention.

FIG. 1A shows an example configuration of a power cable 101 coupled to multiple transformers 102-1 through 102-N. Locator 100 is coupled to cable 101 at a distance $d_1$ from transformer 102-1. Additionally, at length L cable 101 is open (i.e., the cable ends at length L). In FIG. 1a, a transformer 102-2 is located a distance $d_2$ from locator 100, transformer 102-3 is located a distance $d_3$ from locator 100 and transformer 102-N is located a distance $d_N$ from locator 100.

Further, for purposes of illustration, a high resistance cable fault to ground 104 is shown between transformers 102-2 and 102-3 at a distance $L_f$ and a cable splice 106 is shown at a distance of $L_s$ from locator 100. The distances $d_1$ through $d_N$ of transformers 102-1 through 102-N can be any value. Practically, the total length of cable 101 can be any length, but is usually less than about 6 km and is often less than about 5 km. Additionally, in practice there may be any number of splices 106 at any distances $L_s$ and any number of faults 104 located at any distances $L_f$.

In practice, an operator disconnects cable 101 from a transformer 105 (which, in FIG. 1A, is located at the position of locator 100) or other convenient break in the cable of which cable 101 is a part and couples locator 100 into cable 101 at the position of the disconnected transformer. Additionally, if cable 101 is not part of a power loop which ends at disconnected transformer 105, cable 101 at length L is disconnected and left open. A voltage pulse traveling down cable 101, then, is reflected from a change of impedance in the cable. For example, a change in impedance that results from splice 106 and the transformer connections of transformers 102-1 through 102-N, and at length L, the open end of cable 101. In some embodiments, cable 101 can be shorted at length L, which leads to a different reflectance characteristic for a voltage pulse traveling along cable 101.

FIG. 1B illustrates a reflection of a voltage pulse from a medium with a different impedance. Medium 150, which can be a section of cable 101, has an impedance $Z_1$ and medium 151, which can be another section of cable 101, has an impedance of $Z_2$. Pulse 153 travels along medium 150 and is partially reflected from medium 151 and is partially transmitted into medium 151. The amplitude of the reflected voltage pulse, which is reflected from an impedance mismatch between medium 150 and 151, is given by the ratio $$\frac{A_R}{A_0} = X_R = \frac{Z_2 - Z_1}{Z_2 + Z_1}, \quad (1)$$

where $A_R$ represents the amplitude of the reflected pulse 155 and $A_0$ represents the amplitude of the incident voltage pulse 153. The parameter $X_R$, then, indicates the fraction of the amplitude that is reflected. The fraction of the amplitude that is transmitted, then, is given by $$\frac{A_T}{A_0} = X_T = \frac{2\sqrt{Z_1 Z_2}}{Z_2 + Z_1} \quad (2)$$

From equations 1 and 2, an open end (such as at length L of cable 101), where $Z_2$ approaches infinity, yields a reflected pulse 155 of the same amplitude as the incident pulse 153 and no transmitted pulse 154. A short to ground, where $Z_2$ becomes zero (0), yields a reflected pulse 155 which has the negative amplitude of incident pulse 153 and no transmitted pulse 154. A transmitted pulse 154 will have an amplitude in the same sense as that of incident pulse 153. Splice 106 and transformers 102-1 through 102-N, each in effect including two such reflective interchanges, yield both positive and a negative pulse, typically with a positive reflected pulse when the voltage pulse enters the impedance change and a negative reflected pulse when the voltage pulse exits the impedance change since the impedance in a splice or transformer coupling is typically greater than the impedance of cable 101.

The time for incident pulse 153 to travel to the change of impedance and be reflected back to locator 100 is indicative of the distance between locator 100 and medium 151. The velocity of voltage pulses in various standard cables is well known. A chart of example velocities for various well-known cables is given in Table I.

In some embodiments, cable 101 can be an underground concentric type cable, a cross-section of which is shown in FIG. 1C. However, one skilled in the art will recognize that an embodiment of locator 100 can be coupled to any cable type with two or more evenly spaced conductors. In some embodiments, cable 100 can withstand the application of a HV pulse so that fault 104 can be located. Examples of embodiments of cable 101 include primary power cable, secondary power cable, and coaxial cable. A concentric embodiment of cable 101, as shown in FIG. 1C, includes a core 110 and a grounded conducting casing 112 separated by an insulation layer 111. In some embodiments, an outer insulation layer 113 protects grounded conducting casing 112 from environmental deterioration. A fault in cable 101 would, then, result from a breakdown in insulating layer 111 which causes a short, sometimes only when a high voltage (e.g., several kV) is applied between conductor 110 and conductor 112.

TABLE I

| Insulation Type | Insulation Thickness | Voltage Tolerance | Conductor Guage (ground/conductor) | Propagation Velocity (m/µs) | Propagation Velocity (Ft/µs) | relative to the speed of light c |
|---|---|---|---|---|---|---|
| XLPE | 175 | 15 | 1/0 | 76.8 | 252 | 0.51 |
| XLPE |  | 15 | 2/0 | 74.1 | 243 | 0.49 |
| XLPE | 260 | 25 | 1/0 | 76.2 | 250 | 0.51 |
| XLPE | 345 | 35 | 1/0 | 85.3 | 280 | 0.57 |
| EPR | 220 | 15 | 1/0 | 77.4 | 254 | 0.52 |

FIG. 1D shows an example of a transformer 102, which can be any of transformers 102-1 through 102-N of FIG. 1A, coupled to cable 101. Typically, cable 101 enters transformer body 102 with a HV connector set and exits from transformer 102 with another HV connector set. As shown in FIG. 1D, core portion 110 of cable 101 can be coupled through a HV insulated connector 115 (for example a HV elbow type connector) and casing conductor portion 112 of the cable 101 can be coupled through a screw or clamp type connector 116.

FIG. 2 shows an embodiment of locator 100 according to the present invention. Locator 100 includes a computer 201, a pulse generator 220, an amplifier and filter circuit 240, and a digitizer 230. Computer 201 triggers pulse generator 220 into generating voltage pulses. The voltage pulses are coupled into a conductor of cable 101, core 110 in some embodiments, through a coupler 250. In some embodiments, coupler 250 is a high-voltage coupler capable of receiving low voltage pulses from pulse generator 220, coupling reflected pulses from cable 101, and high-voltage pulses from HV Generator 210. Further, coupler 250 can isolate the low-voltage connections from high-voltage pulses that may be utilized in fault location.

The reflected voltage pulse from cable 101 is received in amplifier and filter circuit 240. The output signal from amplifier and filter circuit 240 is received by digitizer 230. The digitized signal from digitizer 230 is then input to computer 201. Computer 201, then, generates a trace of reflected signal versus time, a reflected signal trace, with the time measured from the time of generation of the voltage pulse by pulse generator 220. Since the type of cable is known, the time parameter of the reflected signal trace can be displayed as the corresponding cable distance traveled by the voltage pulse to the impedance mismatch that generates the reflected pulse. Table I illustrates the voltage pulse velocity in various typical cables.

Figure 3A:
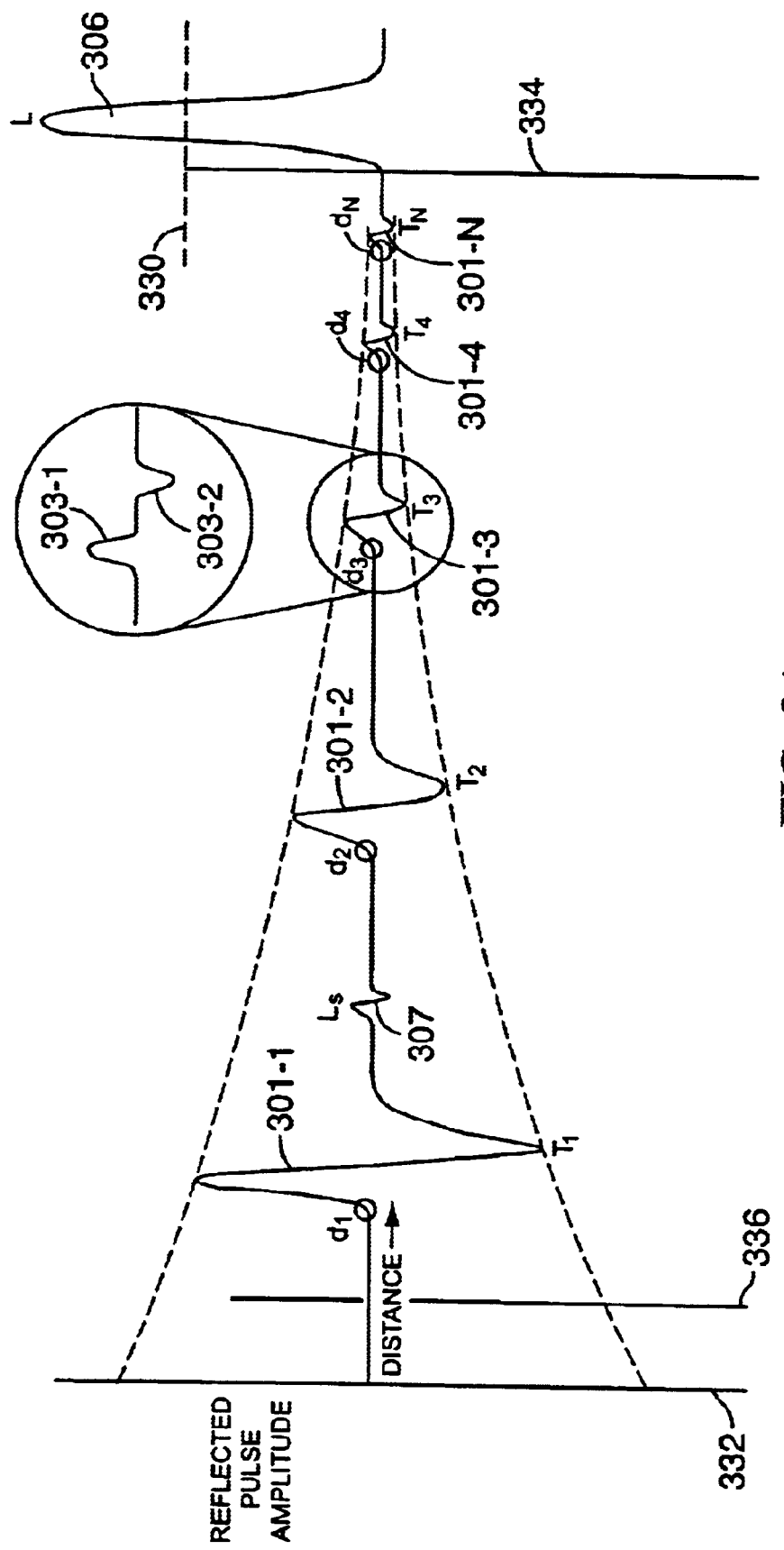
FIGS. 3A, 3B, and 3C show examples of reflected signal traces from a power cable having multiple transformers.

An idealized trace of reflected pulse versus distance is given in FIG. 3A for the example cable 101 shown in FIG. 1A. Reflected wave-form 301-1 corresponds, then, to transformer 102-1; reflected wave-form 301-2 corresponds to transformer 102-2; reflected waveform 301-3 corresponds to transformer 102-3; reflected waveform 301-4 corresponds to transformer 102-4; and reflected waveform 301-N corresponds to transformer 102-N. As shown in the blow-up of waveform 301-3, each of reflected waveforms 301-1 through 301-N includes a first portion 303-1 and a second portion 303-2, with first portion 303-1 corresponding to the reflection from the impedance mismatch entering coupling section 120 (FIG. 1C) of transformer 102-3 (FIG. 1A) and second portion 303-2 resulting from the impedance mismatch exiting coupling section 120 of transformer 102-3. Reflected waveform 306 corresponds to the end of cable 101 at length L. As a check, if the end of cable 101 is shorted to ground rather than left open, then reflected waveform 306, according to Equation 1, will be a negative-amplitude pulse rather than a positive-amplitude pulse. Reflected pulse 307 indicates the pulse reflected from cable splice 106.

In FIG. 3A, each of transformers 102-1 through 102-N have similar characteristics. In that case, the percentage of the input pulse power (which is related to the square of the amplitude of the pulse) at each of transformers 102-1 through 102-N that is transmitted by transformers 102-1 through 102-N is substantially the same. In some embodiments of the invention, the characteristics of each of transformers 102-1 through 102-N can be known and that information can be utilized to normalize the amplitudes of pulses 301-1 through 301-N returning from transformers 102-1 through 102-N, respectively. Pulses traveling on cable 101, however, will be attenuated and dispersed. The power, which is related to the area under the voltage pulse, will be attenuated in an exponential fashion $e^{-\alpha x}$, where x is the distance traveled by the pulse. Further, dispersion will cause the voltage pulse to become broader, spreading the attenuated power of the voltage pulse over a wider time frame.

Reflected Pulses 301-1 through 301-N, then, will have an overall attenuation that is dependent on the distance between locator 100 and the reflecting one of transformers 102-1 through 102-N. For example, reflected pulse 301-2, which is reflected from transformer 102-2, suffers attenuation and dispersion as a result of the voltage pulse traveling the distance between locator 100 and transformer 102-2, $d_2$, and reflected pulse 301-2 traveling from transformer 102-2 back to locator 100, $d_2$, as well as loss of signal due to reflections traveling through transformer 102-1 and splice 106. Therefore, the amplitude of reflected pulse 301-2 at locator 100 is approximately given by $$A_2 = A_0 e^{-\alpha(2d_2)}(X_T(T_1)X_R(T_2)X_T(T_1)), \qquad (3)$$

where $A_0$ is the amplitude of the voltage pulse generated by pulse generator 220, the exponential term is the attenuation resulting from the voltage pulse traveling to transformer 102-2 and back to locator 100, $X_T(T_1)$ is the fraction of the incident voltage pulse transmitted through transformer 102-1, and $X_R(T_2)$ is the fraction of the incident voltage pulse reflected from transformer 102-2. In general, considering only the effects of transformers 102-1 through 102-N, the intensity of the reflected voltage pulse from the jth transformer, where $1 \leq j \leq N$, is given by $$A_j = A_0 e^{-2\alpha d_j} X_R(T_j) \prod_{k=1}^{j-1} X_T^2(T_k). \qquad (4)$$

In practice, $X_T(T_k)$ is very close to 1 for all transformers 102-1 through 102-N. $X_T(T_k)$ is typically between about 80% to 99% depending on pulse width and pulse sharpness. Therefore, the product in Equation 3 is approximately 1.

Furthermore, since the impedance mismatch between cable 101 and the junction at each of transformers 102-1 through 102-N is not very high, $X_R$ is low. Equation (3) can be rewritten in terms of the amplitude of the reflected wave from transformer 102-1, the first transformer, as $$A_j \approx A_1 e^{-2\alpha(d_j - d_1)}. \quad (5)$$

Equation (5) can, then, be utilized as a basis for identifying the locations of transformers in a reflected signal trace measured by computer 201. Once the reflected voltage pulse from voltage transformers 102-1 and 102-2 has been identified, then the exponential attenuation can be estimated and transformer 102-3 can be identified as the next largest amplitude reflected voltage pulse that substantially adheres to Equation (5). Then, once the reflected pulse from transformer 102-3 has been identified, the amplitudes of the reflected pulse from transformer 102-1 and 102-3 can be utilized to fit the exponential attenuation of Equation (4) and the reflected voltage pulse from transformer 102-4 can be identified as the next largest reflected voltage pulse that substantially lies on the estimated attenuation curve. In some embodiments, the attenuation curve can be recalculated using the amplitude of the reflected voltage peak from transformer 102-1 and the last voltage peak from the transformer just found. In some embodiments, an average of all of the reflected voltage peaks from all of transformers 102-1 through 102-N that have already been found are utilized. In some embodiments, a range of attenuation curves can be calculated using the amplitudes of all of the voltage peaks from transformers 102-1 through 102-N that have already been found.

Figure 3B:
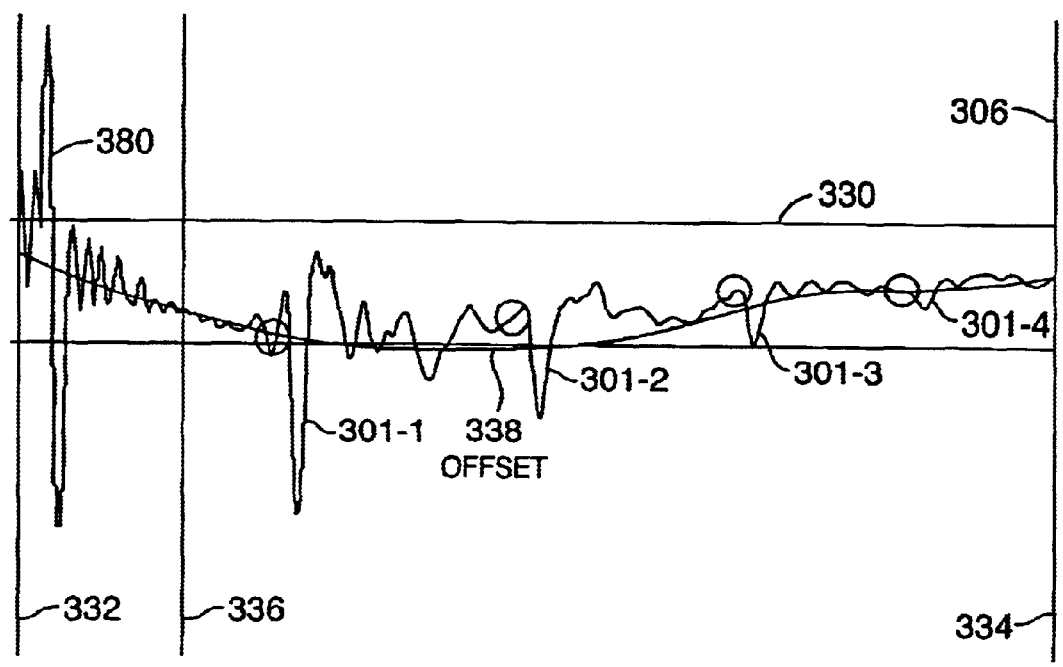

FIG. 3B shows an example of a reflected signal trace showing four identifiable transformers 102-1 through 102-4 giving rise to reflected voltage pulses 301-1 through 301-4, respectively. The reflected peak 320 results from the coupling between pulse generator 220 and cable 101. Therefore, in order to identify the locations of voltage peaks 301-1 through 301-4, locator 100 should ignore the close-in distances near the beginning of cable 101. Since transformers are often separated by at least 100 ft, up to 100 ft at the beginning of cable 101 can be ignored.

The pulse width of the voltage pulse generated by pulse generator 220 depends on the length of cable 101. The amount of power input to the voltage pulse is related to the area under the pulse. Although a wider width voltage pulse will allow the ability to detect signals on cables with greater length L, better resolution is obtained with narrower pulses. In some embodiments, a pulse of amplitude of about 10 V and width of about 50 ns can be utilized to detect transformers 102-1 through 102-N on cable 101 of length up to about 1500 m. In some embodiments, the voltage amplitude of the voltage pulse can range from about 10V to about 50V and the width can range from about 25 ns to about 100 ns.

Further, FIG. 3B shows a very low frequency offset 338 that occurs in time. This offset further needs to be filtered from the reflected pulse signal in order that calculations of the exponential attenuation of the reflected voltage pulses 301-1 through 301-4 from transformers 102-1 through 102-4 can be determined. In some embodiments, this filtering is accomplished digitally in computer 201. In some embodiments, an analog filter can be included in amplifier and filter circuit 240.

The reflected voltage pulse signals from cable 101 are received in amplifier filter 240. In some embodiments, filter 240 includes a high pass filter which does not allow the very low frequency signals, including a DC offset voltage, to pass. In some embodiments, pulse generator 220 and amplifier and filter circuit 240 are coupled to cable 101 through HV coupler 250, which can remove a high DC voltage (e.g., on the order of 10 kV) that may be applied to cable 101 by HV surge generator 210. In some embodiments, the gain of amplifier and filter circuit 240 is set at a constant value. However, in some embodiments a distance-dependent gain, i.e. a gain that may be altered as a function of time to offset the exponential attenuation described by Equation (4), can be applied. The exponential function of the gain, in those embodiments, can be determined by computer 201. Alternatively, amplifier and filter circuit 240 can include an automatic gain circuit which generates the appropriate gain as a function of time in response to parameters received from computer 201 or from the operator.

The output signal from amplifier and filter circuit 240 is input to digitizer 230. Digitizer 230 digitizes the reflected voltage pulse signal for input to computer 201. As shown in the reflected voltage trace of FIG. 3B, identification of transformers 102-1 through 102-N can be difficult due to DC offsets from impedance mismatches, as well as from specific hardware characteristics of the filtering circuit (which can cause a "wavy" effect in the reflected pulse trace) and other factors. To further complicate matters, ghost transformer reflections can appear. A reflected pulse indicating a ghost transformer is a result of multiple reflections between transformers. For example, a portion of the reflected pulse from transformer 102-3 is itself reflected from transformer 102-2 and again by transformer 102-3 before traveling back to locator 100. The resulting reflections indicate a ghost image of the reflected pulse from transformer 102-3 at a distance $(d_3 - d_2)$ beyond transformer 102-3. Software executing on computer 201 can assist the operator in properly identifying transformers 102-1 through 102-N and, therefore, locating the position of faults or splices in the cable relative to transformers 102-1 through 102-N.

Computer 201 includes a CPU 202 coupled to an internal memory 203. Memory 203 can be any RAM or ROM memory, including SRAM, DRAM, flash memory or EPROM. In some embodiments, computer 201 includes a removable storage medium 204, which can be a CD-ROM drive, a magnetic drive such as a floppy disk drive or magnetic tape, a RAM or ROM drive or any other medium on which data and programming can be stored. In some embodiments, computer 201 communicates with pulse generator 220, amplifier and filter circuit 240, and digitizer 230 through interface 205. Further, computer 201, through interface 206, communicates with an operator through display 207 and input device 208. Display 207 can be any display. Hard drive 209 can be any fixed storage medium for storing programs and data. In some embodiments, display 207 is at least capable of displaying the trace of reflected voltage pulses as a function of time (or distance). User input 208 allows the operator to input data to computer 201. A software algorithm can be stored on hard drive 209 or removable medium 204 and may be loaded into memory 203.

Figure 5:
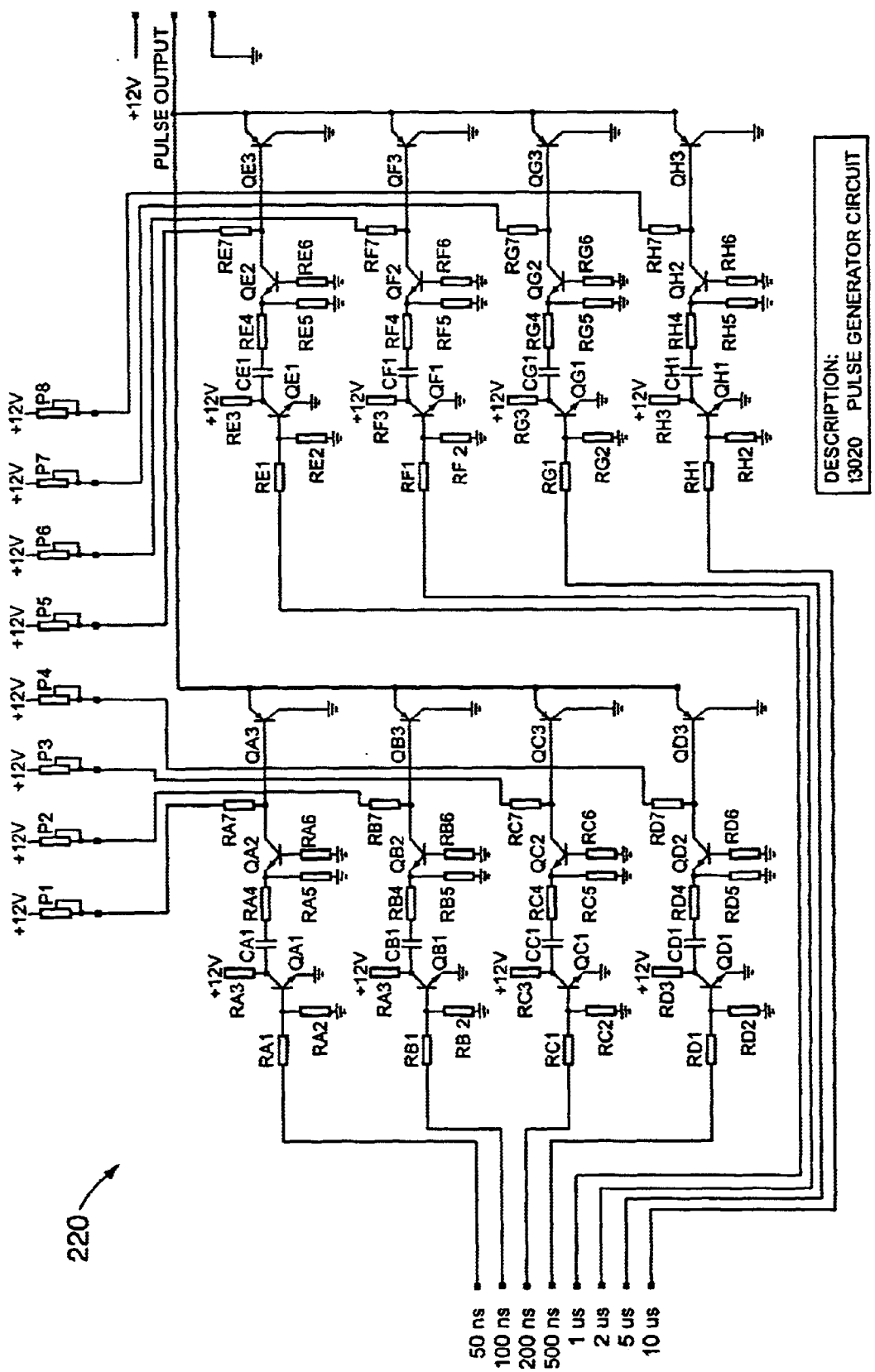
FIG. 5 shows an example embodiment of a pulse generator circuit.
Figure 6A:
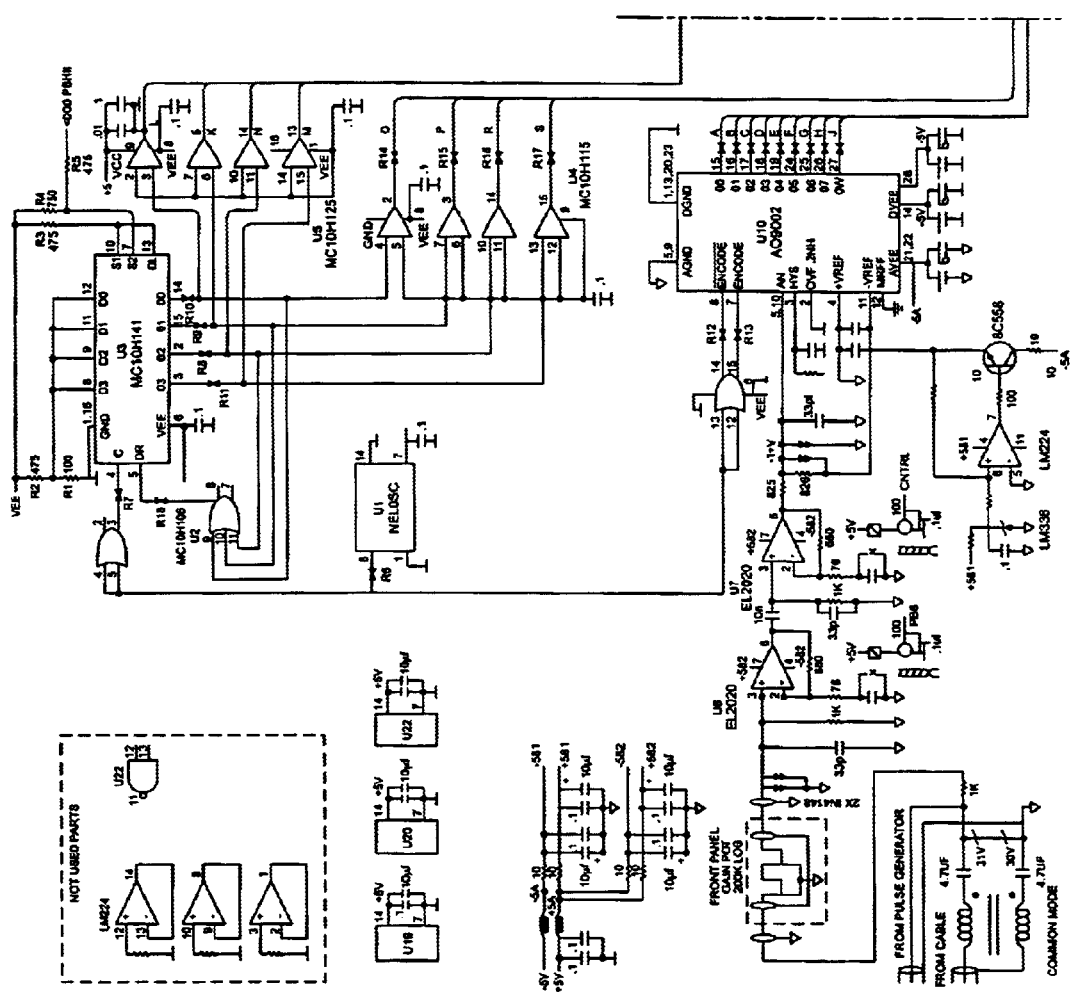
FIG. 6 shows an example embodiment of a digitizer circuit.
Figure 6B:
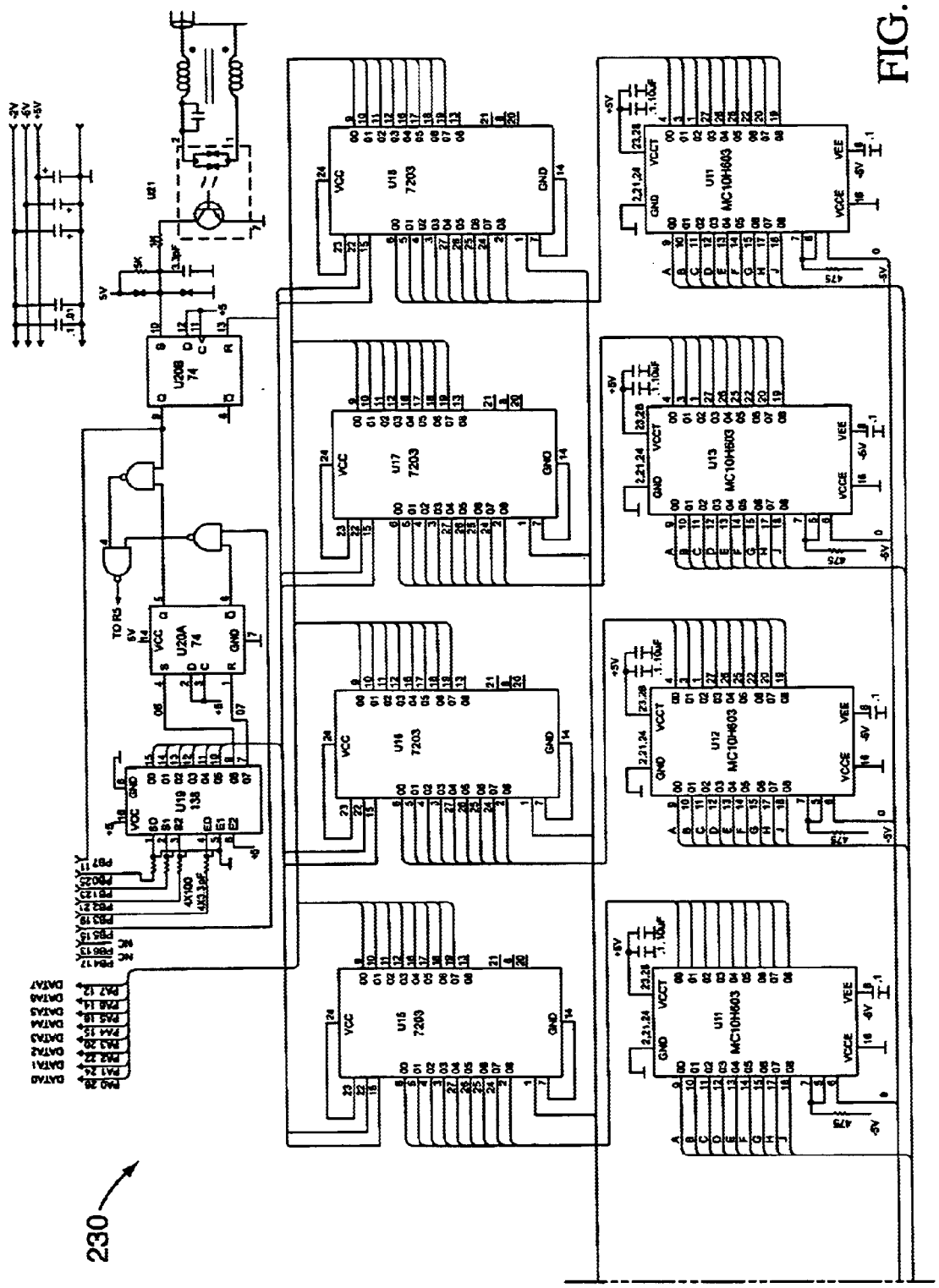

As such, computer 201 can be any computer system. Computer 201, for example, can be a generic IBM PC compatible with 4M RAM, 386DX or higher model CPU with floppy disk or solid state disk. Display 207 can be a VGA compatible LCD or CRT type with resolution of 640×480, black&white, grayscale or color. Input 208 can be a standard keyboard or any pointer device such as a mouse or optical pointer. Additionally, pulse generator 220 can be HDW Inc. T3020 pulse generator circuit board, amplifier filter 240 can be HDW Inc. T3020 ADC board gain circuit and digitizer 230 can be a HDW T3020 ADC board digitizer circuit. In embodiments that include HV generator 210 and HV Coupler 250, HV generator 210 can be HDW Inc. SG15-1120 (with built in HV Coupler). For example, FIG. 5 shows an embodiment of pulse generator 220 and FIG. 6 shows an embodiment of digitizer 230.

Figure 3C:
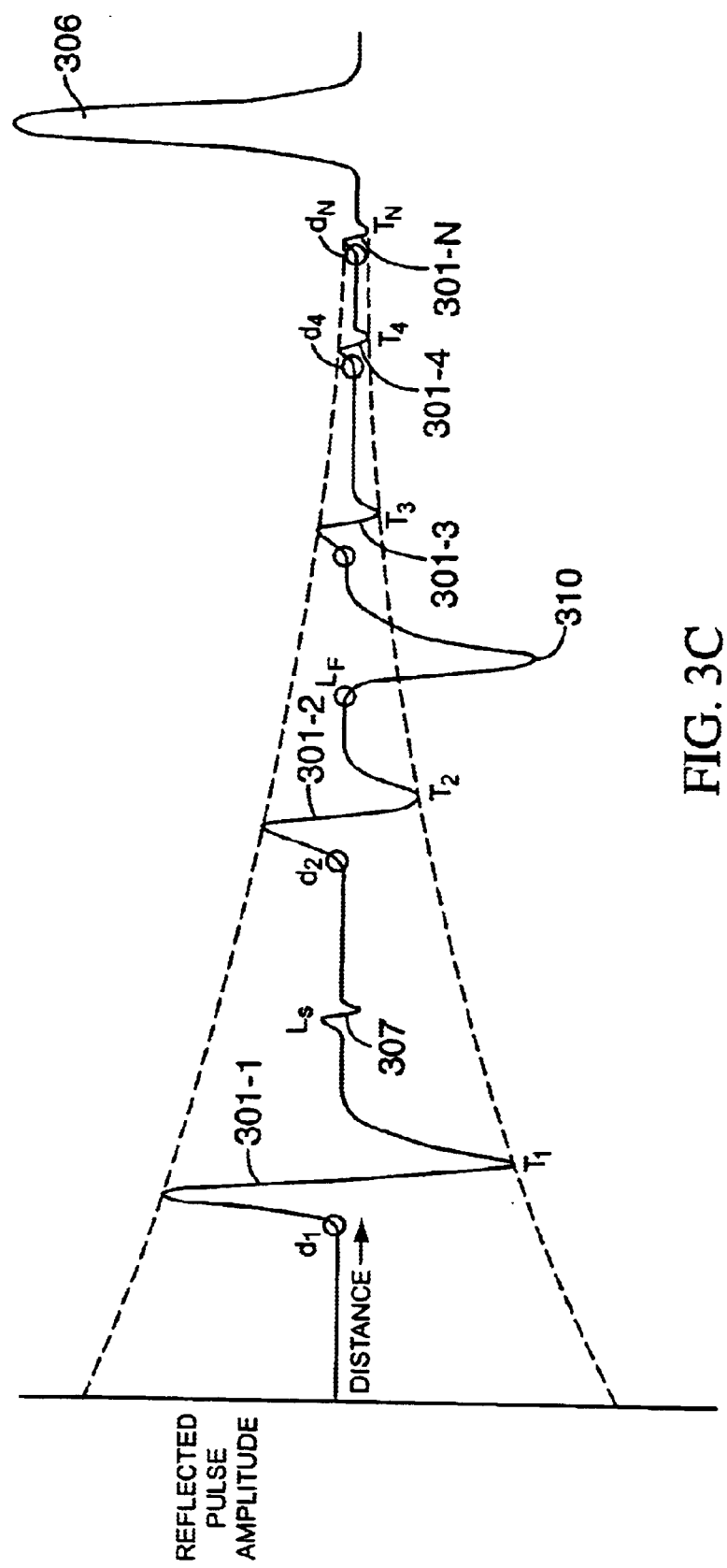

In some embodiments, HV generator 210 is operated by the operator with instructions from computer 201. In some embodiments, HV generator 210 can be interfaced through interface 205 with computer 201 so that computer 201 can automatically apply high voltage to cable 101 through HV coupler 250. When high voltage is applied to cable 101, faults on cable 101 (for example fault 104) break down and act as a short. From Equation 1 above, a short yields a reflected voltage pulse with a negative amplitude. FIG. 3C shows an idealized reflected voltage trace of cable 101 with high voltage applied to cable 101 superimposed on the reflected trace shown in FIG. 3B, which allows the operator to locate the fault on cable 101. On FIG. 3C, the fault is located at $L_F$ as indicated by reflected voltage peak 310. In the reflectance trace with high voltage on, which results in fault trace 310, no transformers that are further out than the fault will be detected.

In general, faults are detected when HV Generator 210 is on and applying a high voltage to cable 101 through port 211. The high voltage can be in the few kV range to a few tens of kV range. The effect of the high voltage is to cause dielectric breakdown in the weak part of cable 101 that corresponds to the fault, fault 104 in FIG. 1A, for example. The dielectric breakdown acts, to the voltage pulse generated by pulse generator 220, as a short to ground.

In some embodiments, computer 201 controls each of pulse generator 220 and HV generator 210, in embodiments that include HV Generator 210. In other embodiments, computer 201 may provide instructions for the operator and the operator may control pulse generator 220 and HV generator 210. In essence, however, a voltage pulse is generated by pulse generator 220 and a reflected pulse trace is received by amplifier and filter circuit 240. Computer 201 performs operations on the reflected pulse trace in order to locate transformers 102-1 through 102-N on cable 101, splice 106, and, when HV generator 210 is supplying voltage, fault 104.

Figure 4A:
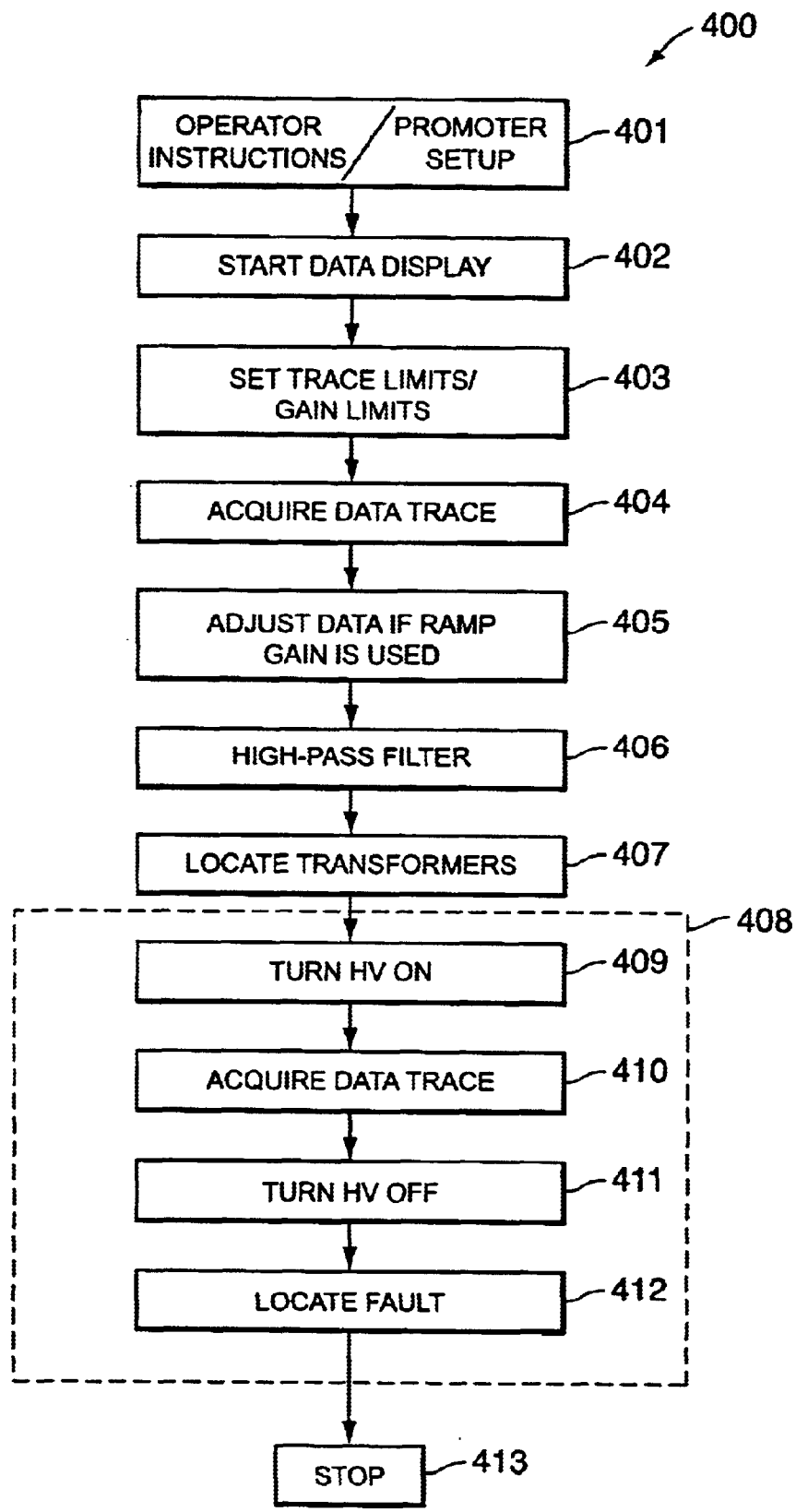
FIGS. 4A and 4B show an embodiment of an algorithm for locating transformers and faults according to the present invention.

FIG. 4A shows a block diagram of an algorithm 400 for locating transformers on a cable such as cable 101. Algorithm 400 can be stored on hard drive 209 or removable medium 204. Further, algorithm 400 may be stored or loaded into memory 203. Algorithm 400 is then executed by computer 201. Algorithm 400 can control pulse generator 220 and HV generator 210 directly through interface 205 or, alternatively, by instructing the operator to perform operations directly on pulse generator 220 and HV generator 210.

Algorithm 400 starts with step 401. In step 401, algorithm 400 can give the operator instructions regarding how to connect locator 100 to cable 101. Additionally, the operator can indicate the cable type (see, for example, Table I) so that algorithm 400 can display reflected signal traces in units of distance along cable 101 as opposed to time-of-receipt of the reflected signal.

In step 402, algorithm 400 starts pulse generator 220. The amplitude and width of the voltage pulse is set during step 402. In some embodiments, the amplitude and width are set initially at amplitude approximately 20V and width at approximately 50 ns to approximately 100 ns. The amplifier gain and pulse width parameters can be adjusted as needed. In some embodiments, algorithm 400 may instruct the operator to set parameters directly in pulse generator 220. In some embodiments, algorithm 400 can, through interface 205 (FIG. 2), set parameters on pulse generator 220 and start generator 220 and digitizer 230. Further, data can be acquired and displayed via interface 205. In some embodiments these can be done continuously in a loop so that the operator can readjust the amplifier gain as needed.

In step 403, the unprocessed reflected pulse trace is displayed on display 207. In some embodiments, during step 403 each pulse generated by pulse generator 220 results in a reflected pulse trace that is displayed on display 207. The range of the reflected pulse trace can correspond to the time that the pulse is generated and the time that the next pulse is generated. In some embodiments, the reflected pulse trace displayed during this step can be signal averaged over multiple voltage pulses.

Further in step 403, an overall gain value can be set. The gain value can be output to amplifier and gain circuit 240 or, in some embodiments, a digital gain can be set. Algorithm 400 can attempt to locate peak 306 by searching the reflected signal trace for positive peaks and identifying the largest positive peak of the reflected signal trace. The overall gain can be set so that the positive peak 306 indicating the end of cable 101 is above a threshold value 330. Additionally, as previously discussed, a distance dependent gain can be generated and applied to amplifier and filter circuit 240.

The operator can verify that the positive peak located actually is peak 306 indicating the end of cable 101. One method of checking to be sure that peak 306 has been found, as opposed to another peak which may be a fault in cable 101, is to ground the currently open end of cable 101 and observe that peak 306 has become a negative amplitude peak (in accordance with Equation 1) as opposed to a positive amplitude peak. Another check on whether the positive reflected pulse peak corresponds to peak 306 is to check the cable length L against the known length of cable 101. Further, a display of the reflected signal trace beyond peak 306 should indicate no more positive peaks which could be peak 306.

Once the operator has verified that the positive peak found is actually peak 306 (FIG. 3B), a begin cable point 332 and an end of cable point 334 can be set. Algorithm 400 indicates begin cable point 332 as data returning immediately after the voltage pulse is generated. End cable point 334 is the start of the rise of peak 306, indicating the actual end of cable 101. Additionally, the operator can set an ignore point 336 so that only data received between ignore point 336 and end of cable point 334 are considered in further calculations. The ignore point 336 is set by the operator so that effects from feeding the voltage pulse into the cable 101 can be neglected.

Once the gain values and the trace limits are set, algorithm 400 can acquire reflected signal trace data in step 404. In some embodiments, the reflected signal trace data acquired in step 404 can be the last signal trace received. In some embodiments, step 404 signal averages over several pulses in order to acquire a signal trace with a high signal to noise ratio. In some embodiments, the operator can determine how many signal traces should be averaged.

If a distance-dependent gain is set in step 403, then the effects of that gain can be reversed in step 405. In step 405, then, the reflected voltage trace acquired in step 404 can be multiplied by another distance dependent gain which is the inverse of the distance dependent gain applied in step 403.

In step 406, the signal trace acquired in step 405 is filtered by a high-pass filter. The high pass filter removes the low frequency voltage offset 338 that, for example, is shown in FIG. 3B. The high pass filter, for example, may pass signals having frequency higher than about $f_c=0.5$ MHz to about $f_c=5$ Mhz, depending on distance.

In step 407, transformers 102-1 through 102-N are located. In the reflected trace shown in FIG. 3B, four transformers are located. In the reflected traces of FIGS. 3A and 3C, N transformers can be found. Since in many instances, the negative peaks of signals 301-1 through 301-N are more reliable than the positive peaks (i.e., the negative peaks of reflected pulses 301-1 through 301-N are sharper and better defined), in most embodiments algorithm 400 concentrates on the negative peaks. In some embodiments, the operator can choose which polarity of peaks to use to locate transformers.

Figure 4B:
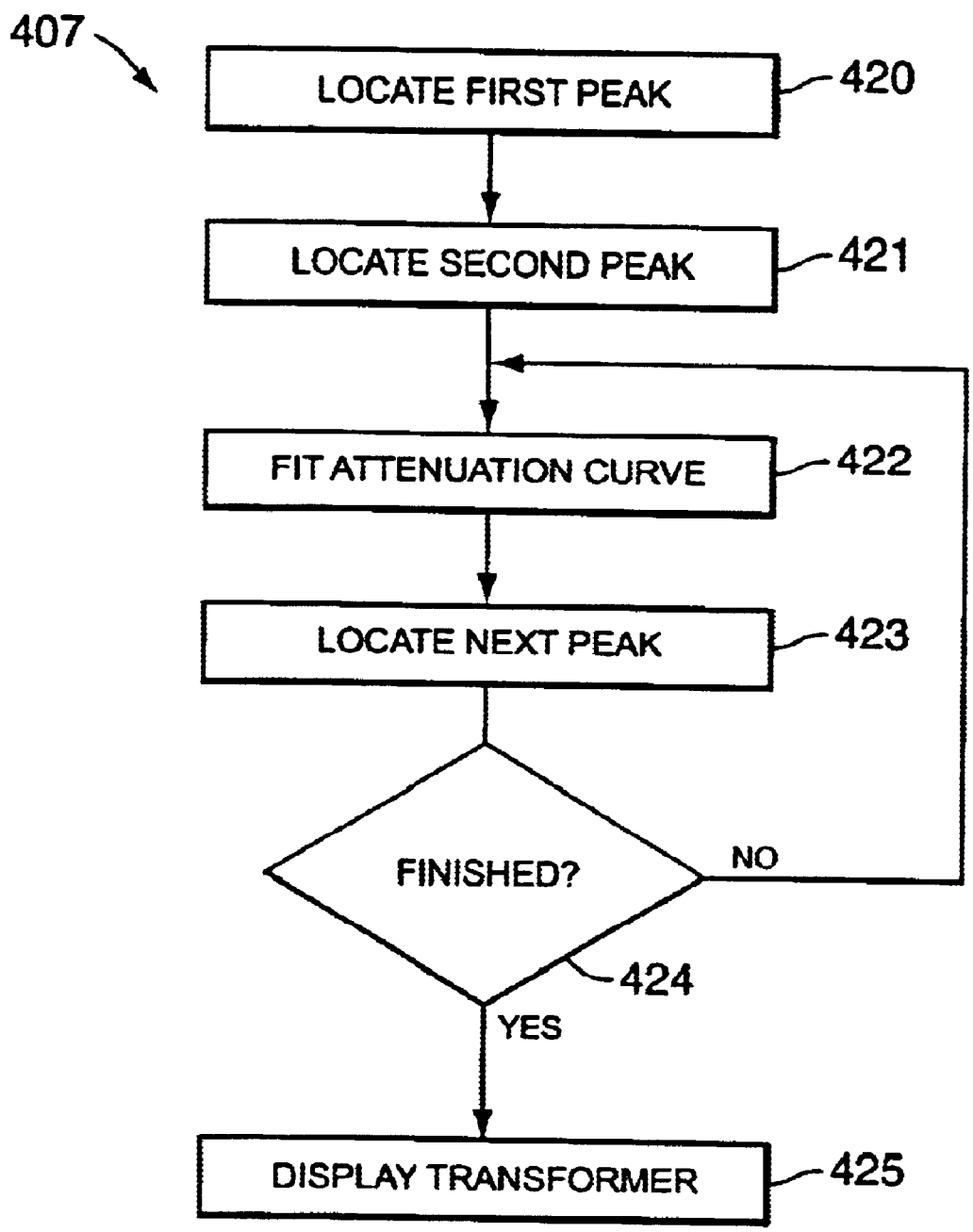

FIG. 4B shows an embodiment of an algorithm of step 407 for locating transformers 102-1 through 102-N on cable 101. In step 420, the most negative peak between ignore point 336 and end-of-cable point 334 is located. The most negative peak corresponds to transformer 102-1. The next most negative peak between ignore point 336 and end-of-cable point 334 corresponds to transformer 102-2. Transformer 102-2 is located in step 421 Although there is the possibility that a splice or fault may yield a negative peak that has higher amplitude than that of transformer 102-2, that possibility is unlikely and, in some embodiments, can be prevented through operator intervention. In step 422, the amplitude and location of the most negative peak and the amplitude and location of the next most negative peak are utilized to fit an attenuation curve. In embodiments without distance-dependent gain, the attenuation curve is an exponential such as that given by Equation (4). In step 423, the negative reflection peak corresponding to the next transformer can be located by locating the next negative peak that substantially falls on the attenuation curve calculated in step 422. In step 424, step 407 checks to see if end-of-cable 334 has been reached without finding another transformer. If not, then step 407 returns to step 422 where another attenuation curve is calculated. In some embodiments, the new attenuation curve is calculated based on the negative reflected peak from transformer 102-1 and the new reflected peak located in step 423. In some embodiments, the negative reflected peaks from each of transformers 102-1 to the one located in step 423 are utilized to estimate the attenuation curve.

If, in step 424, end-of-cable 334 has been located, then step 407 finds and displays the location of transformers 102-1 through 102-N which correspond to the negative reflected peaks that have been found in step 425. The actual location of transformers 102-1 through 102-N is indicated by the incidence of the positive peak of the corresponding reflected pulse. For example, the beginning of the position portion of reflected pulse 301-1. In some embodiments, a mark (e.g., a circle) is displayed at the estimated location of transformers 102-1 through 102-N on display 207, corresponding to the leading edge of reflected pulses 301-1 through 301-N, respectively.

In some embodiments, the operator can then, for example by moving a pointer, determine the distance $d_1$ through $d_N$ to each of transformers 102-1 through 102-N based on the reflected pulse trace. Additionally, the operator can locate splice 106 or other impedance mismatches which may appear in the reflected pulse trace by locating a pointer on reflected pulse 307 and reading the distance from display 207. In some embodiments, the reflected signal trace can be stored, for example, in hard drive 209 or removable medium 204.

As shown in FIG. 4A, in some embodiments algorithm 400 can also apply a high voltage to cable 101 to locate fault 104 in step 408. In many situations, fault 104 does not become apparent to low voltages, such as the voltage amplitudes of voltage pulses generated by pulse generator 220, unless a short to ground can be created. By applying a high voltage to cable 101, a short-to-ground can be created at fault 104, which can be determined.

In step 409, HV Generator 210 is turned on and a high voltage is applied to cable 101 through a HV coupler 250. In some embodiments, the operator can be instructed by algorithm 400 to turn HV Generator 210 on. In some embodiments, computer 201 (after providing sufficient warnings) can turn HV Generator 210 on. Typically, HV Generator 210 can be started at a low voltage (e.g., 7 kV), which can be increased until a sufficient reflected voltage pulse 310 as shown in FIG. 3C appears. Therefore, in step 409 a continuous display mode can be utilized to display the reflected signal trace received from each voltage pulse from pulse generator 220. Further, for example, HV generator 210 can be started to generate a high voltage at around 7 kV and increased until peak 310 is visible. In step 410, data may be acquired by saving the most recent reflected signal trace or, in some embodiments, reflected signal traces from several voltage pulses can be averaged. In step 411, HV generator 210 is shut off and cable 101 is shorted to ground to remove built up charge which, if not removed, could present a safety problem.

In step 412, algorithm 400 displays the reflected signal trace with the location of all of transformers 102-1 through 102-N and the reflected signal trace having pulse 310, as well as pulses 301-1 through 301-N. In some embodiments, algorithm 400 displays both traces overlapping so that the operator can visibly locate fault 104 relative to transformers 102-1 through 102-N. Additionally, the operator can determine the location of fault 104 relative to either of the transformers adjacent to it, for example transformers 102-2 and 102-3 in FIG. 3C. Algorithm 400 halts in stop step 413.

As such, locator 100 according to the present invention can be easily utilized by a worker to locate fault 104 without segmenting cable 101 between each of transformers 102-1 through 102-4. Once fault 104 is located, workers can proceed to the location of the fault and affect repairs. Location and repair of fault 104, then, becomes much more reliable and much faster, decreasing the duration of power outages that result from fault 104.

CD-ROM Appendix A, which is included herein by reference in its entirety, is a computer program listing appendix with source code that performs an embodiment of algorithm 400. The directory of files included in CD-ROM Appendix A is listed as Appendix B below, which is also included herein by reference in its entirety.

The above described embodiments are exemplary only and are not intended to be limiting. One skilled in the art will recognize several variations that fall within the spirit and intended scope of this disclosure. As such, the invention is limited only by the following claims.

M-9917 US
781039 v1

Appendix B
(Directory of CD-ROM Appendix A)

Volume in drive D is 010719_1514
Volume Serial Number is 7C80-DCC7

Directory of D:\

| | | | | |
|---|---|---|---|---|
| 07/19/01 | 03:15p | <DIR> | | . |
| 07/19/01 | 03:15p | <DIR> | | .. |
| 11/03/00 | 11:49a | | 1,692 | CABLE.TXT |
| 06/11/01 | 02:00p | | 10,583 | DRTC1_C.TXT |
| 01/07/01 | 08:36a | | 20,122 | IERR_C.TXT |
| 04/11/01 | 07:36a | | 5,635 | T3020C_C.TXT |
| 06/29/01 | 11:26a | | 242,226 | T3020_C.TXT |
| | 7 File(s) | | 280,258 bytes | |

Total Files Listed:
        7 File(s)      280,258 bytes
                              0 bytes free

We claim:

1. A method of locating the position of transformers on a cable, comprising:
   acquiring a reflected signal trace from the cable by monitoring reflected voltage pulses from a voltage pulse applied to the cable;
   determining the location and amplitude of a first peak in the reflected signal trace that corresponds to reflection of the voltage pulse from a first transformer;
   determining the location and amplitude of a second peak in the reflected signal trace that corresponds to reflection of the voltage pulse from a second transformer;
   determining an attenuation curve based on the location and amplitude of the first peak and the location and amplitude of the second peak; and
   determining the location and amplitude of a third peak in the reflected signal trace that substantially lies on the attenuation curve, the third peak identified as corresponding to reflection of the voltage pulse from a third transformer.

2. The method of claim 1, further including determining a fault location on the cable, the fault location being indicative of a fault peak on a second reflected signal trace.

3. The method of claim 2, wherein determining the fault location includes applying a high-voltage to the cable while acquiring the second reflected signal trace.

4. The method of claim 1, wherein the first peak, the second peak, and the third peak are included in a set of locatable peaks and further including finding the remaining peaks in the set of locatable peaks, each of the locatable peaks corresponding to one of the transformers on the cable.

5. The method of claim 4, wherein finding the remaining peaks includes:
   determining a subsequent attenuation curve based on the location and amplitude of a first located peak and a second located peak, the first located peak and the second located peak being ones of the set of locatable peaks that have been located; and
   determining the location and amplitude of a subsequent one of the locatable peaks in the reflected signal trace that substantially lies on the subsequent attenuation curve.

6. The method of claim 5, further including finding a fault location relative to the transformer locations indicated by the set of locatable peaks by acquiring a second reflective signal trace with a fault peak.

7. The method of claim 1, further including filtering the reflected signal trace in a high pass filter.

8. The method of claim 1, further including setting search limits, the search limits corresponding to a first position and a second position between which peaks indicative of transformers are located.

9. The method of claim 8, further including determining the position of the end of the cable in the reflected signal trace and assigning the second position to the position of the end of the cable.

10. The method of claim 9, wherein the position of the end of the cable is determined by the position of a positive reflection peak in the reflected signal trace.

11. The method of claim 1, wherein the reflected signal trace indicates a reflected voltage signal as a function of time.

12. The method of claim 11, wherein the time parameter is converted to distance by known velocity properties of the cable.

13. The method of claim 1, wherein applying a voltage pulse to the cable includes instructing an operator to control a pulse generator.

14. A method of locating a fault on a cable, comprising:
   identifying the positions of transformers on the cable in a reflected signal trace by locating a set of peaks in the reflected signal trace that substantially fit an attenuation curve; and
   identifying the positions of faults on the cable.

15. The method of claim 14, wherein identifying the position of transformers comprises:
   acquiring a reflected signal trace from the cable by monitoring reflected voltage pulses from a voltage pulse applied to the cable;
   determining the location and amplitude of a first peak in the reflected signal trace that corresponds to reflection of the voltage pulse from a first transformer;
   determining the location and amplitude of a second peak in the reflected signal trace that corresponds to reflection of the voltage pulse from a second transformer;
   determining the attenuation curve based on the location and amplitude of the first peak and the location and amplitude of the second peak; and
   determining the location and amplitude of a third peak in the reflected signal trace that corresponds to reflection of the voltage pulse from a third transformer, the third peak substantially lying on the attenuation curve.

16. The method of claim 14, wherein
identifying the positions of the fault on the cable comprises:
   applying a high voltage to the cable;
   acquiring a second reflected signal trace having a reflected pulse associated with the fault; and
   comparing the second reflected signal trace with the reflected signal trace to locate the fault relative to the transformers.

17. A transformer locator system, comprising:
   a pulse generator which can be coupled to a cable;
   a digitizer coupled to receive and digitize reflected signals from an amplifier and filter circuit; and
   a computer coupled to the digitizer to received the digitized reflected signals, the computer including a program executable by the computer that determines the locations of transformers coupled to the cable by locating a set of peaks that substantially fit an attenuation curve.

18. The system of claim 17, wherein the program includes instructions for
   acquiring a reflected signal trace from the cable by monitoring reflected voltage pulses from a voltage pulse applied to the cable;
   determining the location and amplitude of a first peak in the reflected signal trace that corresponds to reflection of the voltage pulse from a first transformer;
   determining the location and amplitude of a second peak in the reflected signal trace that corresponds to reflection of the voltage pulse from a second transformer;
   determining the attenuation curve based on the location and amplitude of the first peak and the location and amplitude of the second peak; and
   determining the location and amplitude of a third peak in the reflected signal trace that corresponds to reflection of the voltage pulse from a third transformer, the third peak substantially lying on the attenuation curve.

19. A fault locating system, comprising:
   means for acquiring a reflected signal trace;
   means for determining locations of peaks on the reflected signal trace associated with transformers on a cable, the means for determining including locating peaks in the reflected signal trace that substantially fit an attenuation curve; and means for acquiring a second pulse reflectance trace with a fault peak associated with a fault on the cable.

20. A method of determining the location of a fault relative to a plurality of transformers on a cable, comprising:

acquiring a reflected signal trace from the cable by monitoring reflected voltage pulses from a voltage pulse applied to the cable; and determining pulses corresponding with a plurality of transformers by correlating pulses that are attenuated according to an attenuation curve with individual transformers.

21. The method of claim 20, further comprising:

applying a high voltage to the cable;

acquiring a second reflected signal trace from the cable by monitoring reflected voltage pulses from a voltage pulse applied to the cable; and locating a reflected pulse corresponding to the fault in relation to the pulses corresponding with the plurality of transformers.

22. The method of claim 21, further comprising:

determining the relative distance between the fault and transformers closest to the fault by determining pulses correlated with transformers that are closest to the reflected pulse corresponding to the fault; and correlating a position of the pulses correlated with transformers that are closest to the reflected pulse and the reflected pulse corresponding to the fault with location.

23. The method of claim 22, wherein correlating the position of the pulses includes determining the location from measured times of arrival of the pulse with known transmission characteristics of the cable.

24. A computer readable media, comprising a program code executable by a computer coupled into a fault locator system, the fault locator system including a pulse generator which can be coupled to a cable, and a digitizer coupled to receive and digitize reflected signals from an amplifier and filter circuit;

wherein the program code includes instructions to determine the locations of transformers coupled to the cable by locating a set of peaks that substantially fit an attenuation curve.

25. The computer readable media of claim 24, wherein the fault locator system further includes a high voltage generator coupled to the cable and the program code further includes instructions to apply a high voltage to the cable and determine the location of a fault relative to the locations of the transformers.

* * * * *

UNITED STATES PATENT AND TRADEMARK OFFICE
CERTIFICATE OF CORRECTION

PATENT NO. : 6,683,459 B2
DATED : January 27, 2004
INVENTOR(S) : Gokhan Dindis et al.

It is certified that error appears in the above-identified patent and that said Letters Patent is hereby corrected as shown below:

<u>Column 16,</u>
Line 39, change "to received" to -- to receive --.

Signed and Sealed this

Twenty-ninth Day of June, 2004

JON W. DUDAS
*Acting Director of the United States Patent and Trademark Office*